(12) United States Patent
Ishiharada et al.

(10) Patent No.: US 11,569,094 B2
(45) Date of Patent: Jan. 31, 2023

(54) ETCHING METHOD AND PLASMA PROCESSING APPARATUS

(71) Applicant: Tokyo Electron Limited, Tokyo (JP)

(72) Inventors: Kota Ishiharada, Miyagi (JP); Fumiya Takata, Miyagi (JP); Toshikatsu Tobana, Miyagi (JP); Shinya Morikita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/190,651

(22) Filed: Mar. 3, 2021

(65) Prior Publication Data
US 2021/0305057 A1   Sep. 30, 2021

(30) Foreign Application Priority Data

Mar. 31, 2020 (JP) .............................. JP2020-063108

(51) Int. Cl.
*H01L 21/311* (2006.01)
*H01L 21/67* (2006.01)
*H01J 37/32* (2006.01)

(52) U.S. Cl.
CPC .... *H01L 21/31116* (2013.01); *H01J 37/3244* (2013.01); *H01J 37/32091* (2013.01); *H01J 37/32724* (2013.01); *H01L 21/31144* (2013.01); *H01L 21/67069* (2013.01); *H01J 2237/332* (2013.01); *H01J 2237/334* (2013.01)

(58) Field of Classification Search
CPC ......... H01L 21/31116; H01L 21/31144; H01L 21/67069; H01L 2221/1063; H01L 21/76897; H01L 21/3065; H01L 21/76802; H01J 37/32091; H01J 37/3244; H01J 37/32724; H01J 2237/3341; H01J 2237/3346; H01J 37/32174; H01J 37/32532; H01J 2237/332; H01J 2237/334
USPC ....... 438/706, 710, 712, 714, 717, 719, 720, 438/723, 736, 750; 156/345, 44, 345.45, 156/345.48
See application file for complete search history.

(56) References Cited

U.S. PATENT DOCUMENTS

| 2015/0056814 A1* | 2/2015 | Ling ................. H01L 21/31116 438/705 |
| 2015/0179468 A1* | 6/2015 | Ashraf ................ H01L 21/3086 257/622 |
| 2020/0203174 A1* | 6/2020 | Surla ................. H01L 21/32137 |

FOREIGN PATENT DOCUMENTS

JP    2017-216284    12/2017

* cited by examiner

*Primary Examiner* — Lan Vinh
(74) *Attorney, Agent, or Firm* — IPUSA, PLLC (57) ABSTRACT

An etching method includes: (a) providing, on a support, a substrate having the first region covering the second region and the second region defining a recess receiving the first region, (b) etching the first region until or immediately before the second region is exposed, (c) exposing the substrate to plasma generated from a first process gas containing C and F atoms using a first RF signal and forming a deposit on the substrate, (d) exposing the deposit to plasma generated from a second process gas containing an inert gas using a first RF signal and selectively etching the first region to the second region, and (e) repeating (c) and (d). (c) includes using the RF signal with a frequency of 60 to 300 MHz and/or setting the support to 100 to 200° C. to control a ratio of C to F atoms in the deposit to greater than 1.

19 Claims, 9 Drawing Sheets

|  | 60 MHz | 100 MHz |
|---|---|---|
| First RF signal power (W) | 50 | 200 |
| Flat surface/Corner | 0.84 | 0.89 |
| Selectivity | 1.17 | 1.13 |

ETCHING METHOD AND PLASMA PROCESSING APPARATUS

CROSS-REFERENCE TO RELATED APPLICATION

This application claims priority to Japanese Patent Application No. 2020-063108 filed on Mar. 31, 2020, the entire disclosure of which is incorporated herein by reference.

BACKGROUND

Technical Field

The present disclosure relates to an etching method and a plasma processing apparatus.

Description of the Background

A technique is known for etching a first region containing silicon oxide selectively with respect to a second region containing silicon nitride. One such technique is a self-aligned contact (SAC) process (refer to, for example, Patent Literature 1).

The manufacture of recent miniaturized semiconductor devices involves controlling plasma and byproducts to avoid pattern defects. To improve the selectivity of silicon oxide to silicon nitride, a protective film of byproducts (hereinafter also referred to as a deposit) is formed on the second region.

CITATION LIST

Patent Literature

Patent Literature 1: Japanese Unexamined Patent Application Publication No. 2017-216284

SUMMARY

One or more aspects of the present disclosure are directed to a technique for improving the selectivity of a first region containing silicon oxide to a second region containing silicon nitride.

An etching method according to an aspect of the present disclosure includes (a), (b), (c), (d), and (e). (a) provides a substrate, on a substrate support in a chamber, having a first region containing a first silicon-containing material and a second region containing a second silicon-containing material different from the first silicon-containing material. The second region defines a recess. The first region is received in the recess and covers the second region. (b) etches the first region until the second region is exposed or until immediately before the second region is exposed. (c) exposes the substrate to plasma generated from a first process gas containing carbon atoms and fluorine atoms using a radio-frequency signal and forming a deposit on the substrate. (d) exposes the deposit to plasma generated from a second process gas containing an inert gas using a radio-frequency signal and selectively etching the first region with respect to the second region. (e) repeats (c) and (d). (c) includes using the radio-frequency signal with a frequency of 60 to 300 MHz and/or setting the substrate support to a temperature of 100 to 200° C. to control a ratio of carbon atoms to fluorine atoms contained in the deposit to a value greater than 1.

The technique according to the aspect of the present disclosure improves the selectivity of the first region containing silicon oxide to the second region containing silicon nitride.

DETAILED DESCRIPTION

Exemplary embodiments of the present disclosure will now be described in detail with reference to the drawings. In the drawings, similar components are indicated by like reference numerals, and may not be described repeatedly. The embodiments are illustrated by way of example and not by way of limitation in the accompanying drawings that are not to scale unless otherwise indicated.

Figure 1:
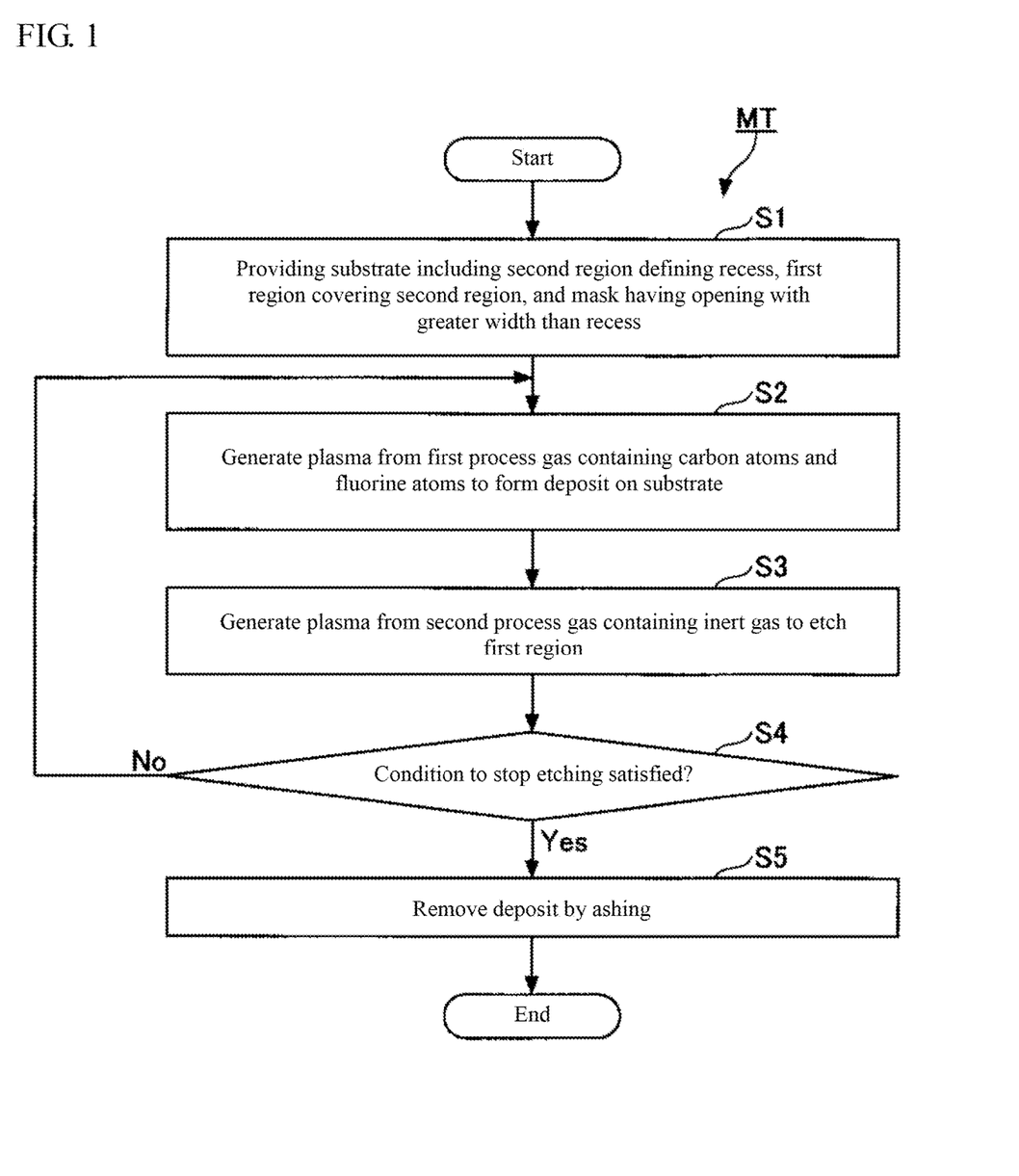
FIG. 1 is a flowchart of an etching method according to an embodiment.

FIG. 1 is a flowchart of an etching method according to an embodiment. The etching method shown in FIG. 1 (hereinafter referred to as a method MT) is used to etch a first region selectively with respect to a second region. The first region is formed from a first silicon-containing material. The second region is formed from a second silicon-containing material different from the first silicon-containing material.

Example Substrate Structure

Figure 2:
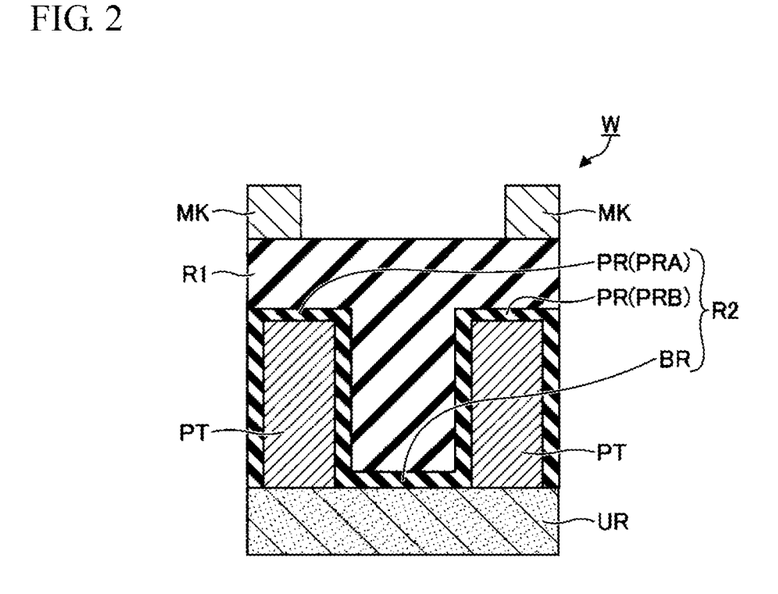
FIG. 2 is a partially enlarged cross-sectional view of an exemplary substrate to be processed with the method shown in FIG. 1.

FIG. 2 is a partially enlarged cross-sectional view of an exemplary substrate W to be processed with the method MT shown in FIG. 1. The substrate W shown in FIG. 2 includes an underlying region UR, a first region R1, and a second region R2. In one example, the substrate W is formed during manufacture of a fin field-effect transistor.

The underlying region UR is formed from, for example, polycrystalline silicon. In one example, the underlying region UR is substantially rectangular parallelepiped, and corresponds to a fin region. The substrate W has multiple protrusions PT. The protrusions PT are on the underlying region UR and substantially parallel to one another. In one example, the protrusions PT each correspond to a gate region.

The second region R2 is formed from the second silicon-containing material different from the first silicon-containing material. The second region R2 is formed from, for example, silicon nitride. The second region R2 covers the protrusions PT and the underlying region UR. The second region R2 includes multiple raised regions PR. The raised regions PR cover the protrusions PT and are raised from the underlying region UR. More specifically, the raised regions PR cover the side surfaces and top surfaces of the protrusions PT. Adjacent two raised regions PR are referred to as a first raised region PRA and a second raised region PRB, between which a recess is defined. The second region R2 further includes bottom regions BR. Each bottom region BR extends at the bottom of the recess. More specifically, each bottom region BR extends on the underlying region UR between the first raised region PRA and the second raised region PRB.

The first region R1 is formed from the first silicon-containing material. For example, the first region R1 is formed from silicon oxide. The first region R1 is received in the recess defined by the second region R2.

The first region R1 covers the second region R2. A mask MK is placed on the first region R1. The mask MK is patterned to define an opening over the recess defined by the second region R2. The opening in the mask MK has a greater width than the recess defined by the second region R2. The mask MK may be an organic film and may be formed by photolithography.

Plasma Processing System

Figure 3:
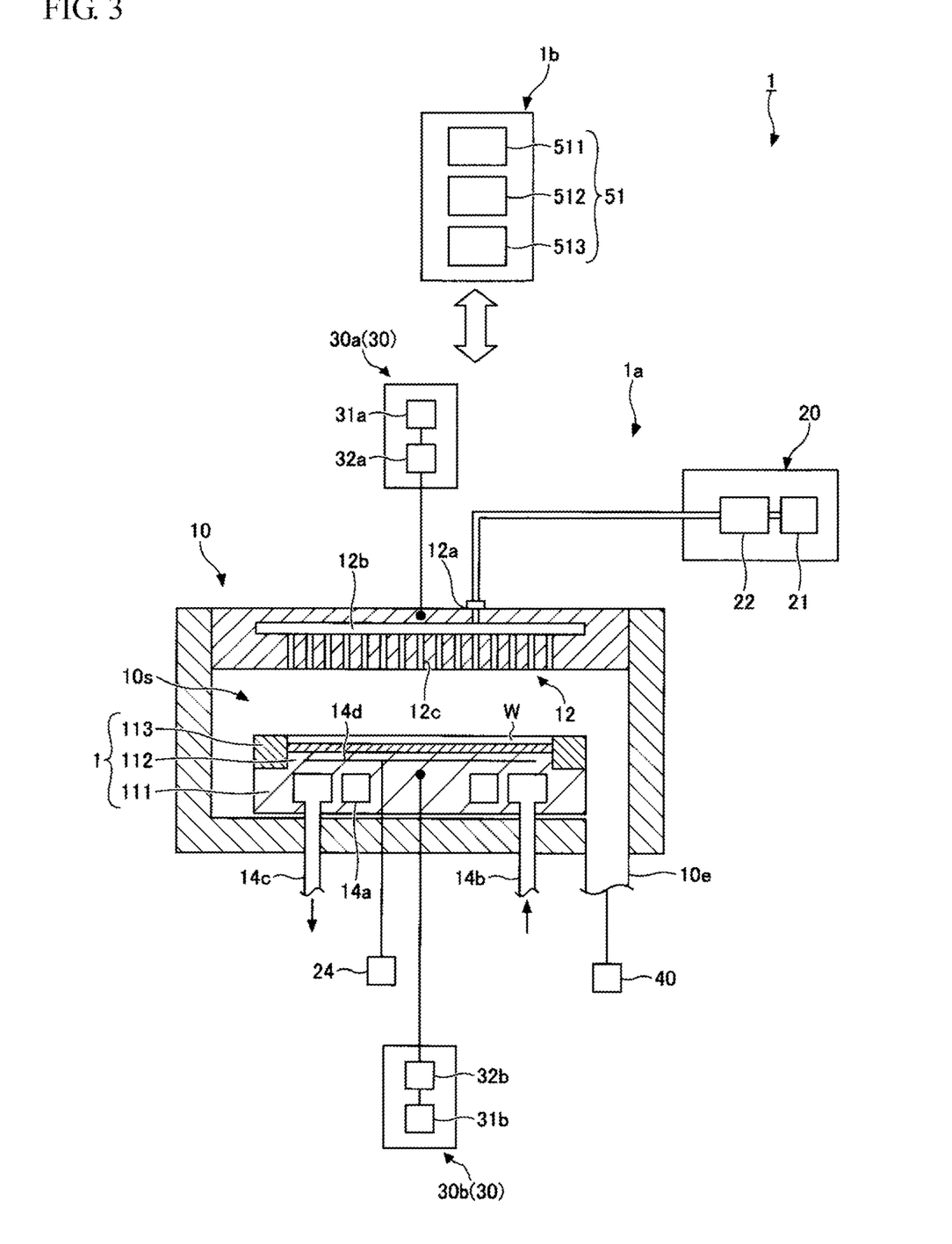
FIG. 3 is a schematic diagram of an exemplary plasma processing system to be used for implementing the method shown in FIG. 1.

FIG. 3 is a schematic diagram of an exemplary plasma processing system 1 to be used for implementing the method shown in FIG. 1.

In one embodiment, the plasma processing system 1 includes a plasma processing apparatus 1a and a controller 1b. The plasma processing apparatus 1a includes a plasma processing chamber 10, a gas supply 20, a radio-frequency (RF) power supply 30, and an exhaust system 40. The plasma processing apparatus 1a further includes a substrate support 11 and an upper shower head electrode 12. The substrate support 11 is located in a lower area in a plasma processing space 10s in the plasma processing chamber 10. The upper shower head electrode 12 is located above the substrate support 11, and may define a part of a ceiling of the plasma processing chamber 10.

The substrate support 11 can support the substrate W in the plasma processing space 10s. In one embodiment, the substrate support 11 includes a lower electrode 111, an electrostatic chuck (ESC) 112, and an edge ring 113. The ESC 112 is on the lower electrode 111 to support the substrate W on its upper surface. The edge ring 113 surrounds the substrate W on the upper periphery of the lower electrode 111.

The lower electrode 111 has an internal channel 14a. A temperature control medium is supplied from a chiller unit (not shown) external to the plasma processing chamber 10 to the channel 14a through an inlet pipe 14b, and returns to the chiller unit through an outlet pipe 14c. The channel 14a carries a temperature control medium such as cooling water or a temperature control fluid such as a heat transfer gas. This structure controls the temperature of the substrate support 11 and the substrate W on the substrate support 11.

A heater 14d, which is a heating element, is located above the channel 14a in the lower electrode 111. The heater 14d is coupled to a heater power supply 24 for receiving a voltage to control the temperature of the substrate support 11 and the substrate W on the substrate support 11.

The substrate support 11 includes a heat transfer gas channel (not shown) for supplying a heat transfer gas such as a helium (He) gas from a heat transfer gas source (not shown) to the back surface of the substrate W. The heat transfer gas improves heat transfer between the substrate support 11 and the substrate W to control the temperature of the substrate W that is electrostatically attracted and held on the support surface of the substrate support 11 by the ESC 112.

The upper shower head electrode 12 supplies one or more process gases from the gas supply 20 into the plasma processing space 10s. In one embodiment, the upper shower head electrode 12 includes a gas inlet 12a, a gas diffusion compartment 12b, and multiple gas outlets 12c. The gas inlet 12a allows passage of fluid between the gas supply 20 and the gas diffusion compartment 12b. The gas outlets 12c allow passage of fluid between the gas diffusion compartment 12b and the plasma processing space 10s. In one embodiment, the upper shower head electrode 12 supplies one or more process gases from the gas inlet 12a through the gas diffusion compartment 12b and the multiple gas outlets 12c into the plasma processing space 10s.

The gas supply 20 may include one or more gas sources 21 and one or more flow controllers 22. In one embodiment, the gas supply 20 supplies one or more process gases from the respective gas sources 21 through the corresponding flow controllers 22 into the gas inlet 12a. The flow controllers 22 may include a mass flow controller or a pressure-based flow controller. The gas supply 20 may further include one or more flow rate modulators that supply one or more process gases at a modulated flow rate or in a pulsed manner.

The RF power supply 30 provides RF power, or for example, one or more RF signals, to one or more electrodes, such as the lower electrode 111, the upper shower head electrode 12, or both the lower electrode 111 and the upper shower head electrode 12. This causes plasma to be generated from one or more process gases supplied into the plasma processing space 10s. The RF power supply 30 may thus at least partially serve as a plasma generator for generating plasma from one or more process gases in the plasma processing chamber 10. In one embodiment, the RF power supply 30 includes two RF generators 31a and 31b and two matching circuits 32a and 32b. The RF power supply 30 includes a first RF power supply 30a including the first RF generator 31a and the first matching circuit 32a. In one embodiment, the first RF power supply 30a provides a first RF signal from the first RF generator 31a via the first matching circuit 32a to the upper shower head electrode 12. For example, the first RF signal may have a frequency of 60 to 300 MHz.

The RF power supply 30 includes a second RF power supply 30b including the second RF generator 31b and the second matching circuit 32b. In one embodiment, the second RF power supply 30b provides a second RF signal from the second RF generator 31b via the second matching circuit 32b to the lower electrode 111. For example, the second RF signal may have a frequency of 400 kHz to 13.56 MHz. The second RF generator 31b may be replaced by a direct-current (DC) pulse generator.

Although not illustrated, the present disclosure may be implemented in other embodiments. In some embodiments, the RF power supply 30 may provide the first RF signal from an RF generator to the lower electrode 111, the second RF signal from another RF generator to the lower electrode 111, and a third RF signal from still another RF generator to the upper shower head electrode 12. In some embodiments, the upper shower head electrode 12 may receive a DC voltage.

In various embodiments, one or more RE signals (e.g., the first RF signal or the second RF signal) may have pulsed or modulated amplitudes. Such amplitude modulation may include pulse-amplitude modulation of an RF signal between an on-state and an off-state, or between two or more different on-states.

The exhaust system 40 may be connected to an outlet 10e in the bottom of the plasma processing chamber 10. The exhaust system 40 may include a pressure valve and a vacuum pump. The vacuum pump may include a turbomolecular pump, a roughing pump, or a vacuum pump combining these.

In one embodiment, the controller 1b processes computer-executable instructions that cause the plasma processing apparatus 1a to perform various steps described in the present disclosure. The controller 1b may control the components of the plasma processing apparatus 1a to perform the various steps described herein. In one embodiment, some or all of the components of the controller 1b may be included in the plasma processing apparatus 1a. The controller 1b may include a computer 51. The computer 51 may include a central processing unit (CPU) 511, a storage 512, and a communication interface 513. The CPU 511 may perform various control operations in accordance with programs stored in the storage 512. The storage 512 may include a random-access memory (RAM), a read-only memory (ROM), a hard disk drive (HDD), a solid-state drive (SSD), or a combination of these memories. The communication interface 513 may communicate with the plasma processing apparatus 1a through a communication line such as a local area network (LAN).

Etching Method

Figure 4:
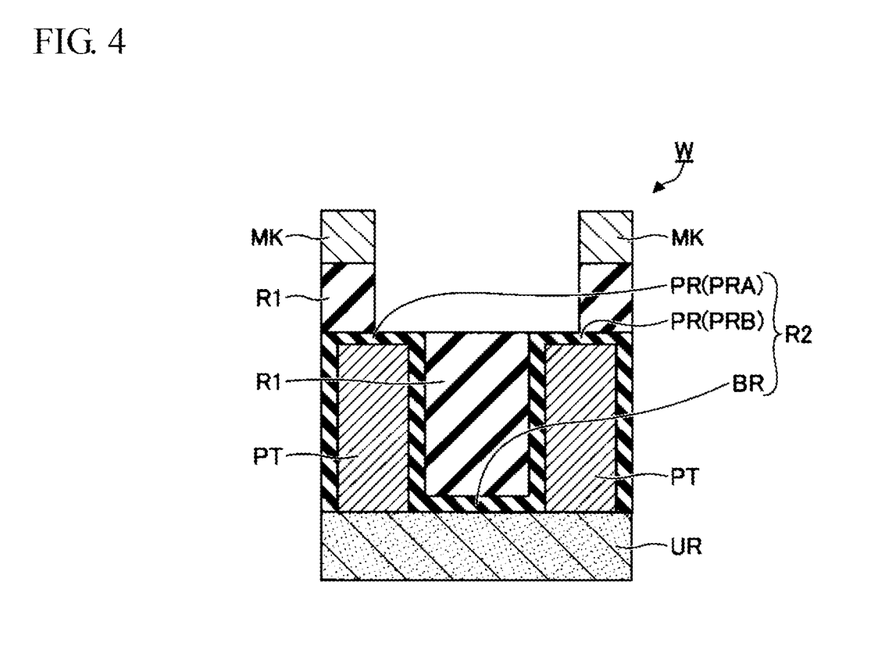
FIG. 4 is a partially enlarged cross-sectional view of the substrate during processing with the method shown in FIG. 1.
Figure 5A:
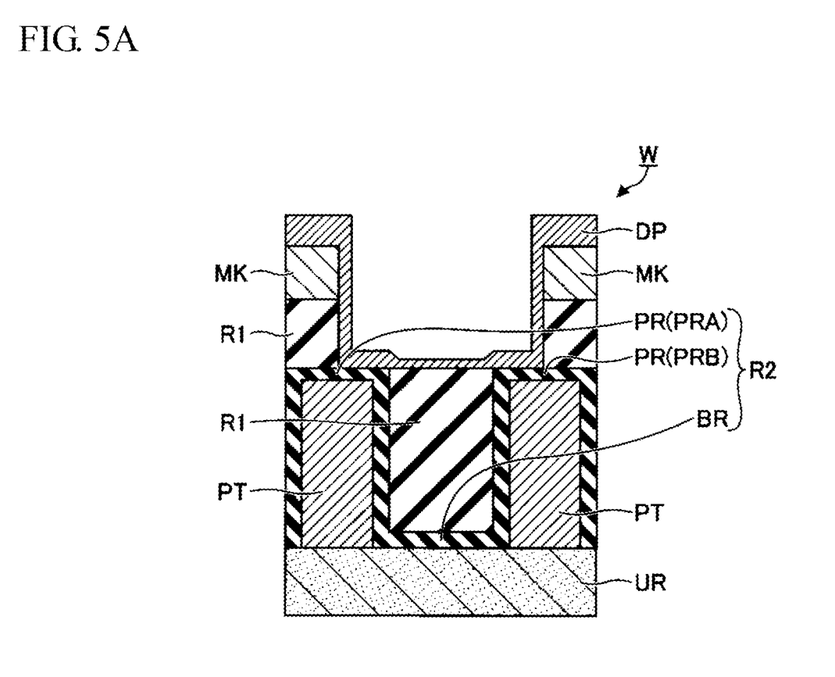
FIGS. 5A and 5B are partially enlarged cross-sectional views of the substrate during processing with the method shown in FIG. 1.
Figure 5B:
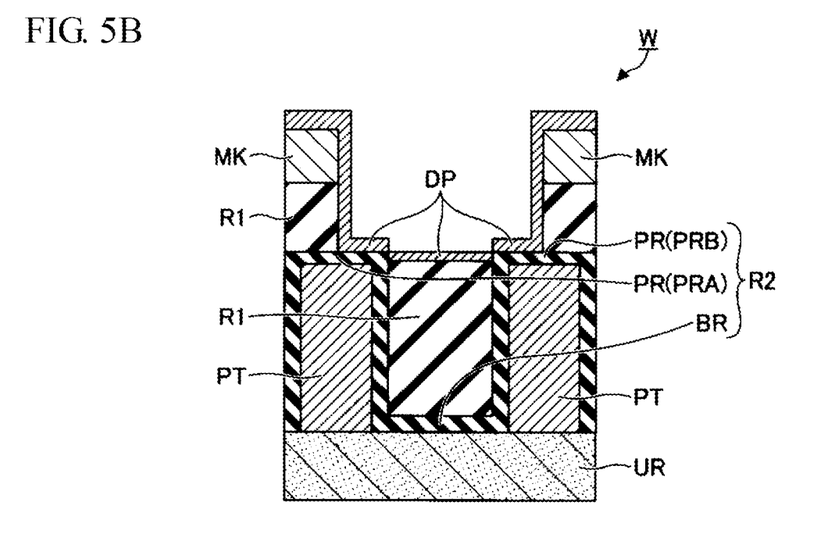
Figure 6:
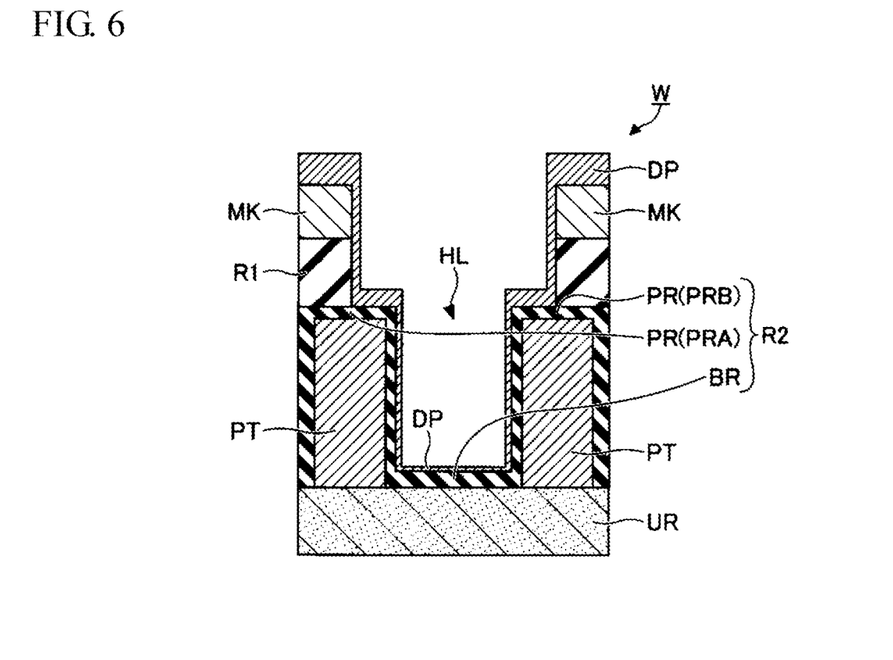
FIG. 6 is a partially enlarged cross-sectional view of the substrate during processing with the method shown in FIG. 1.
Figure 7:
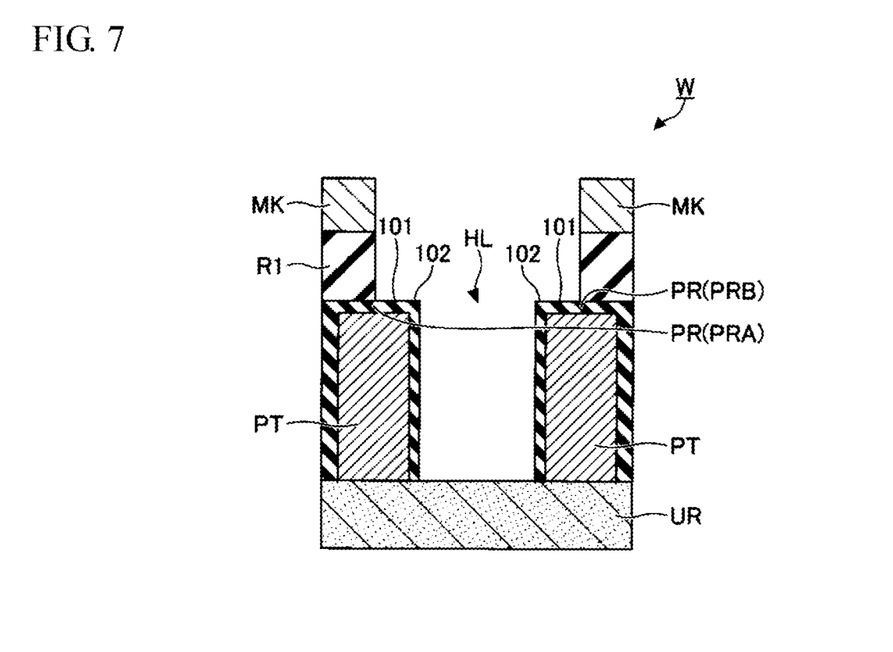
FIG. 7 is a partially enlarged cross-sectional view of the substrate during ashing with the method shown in FIG. 1.

Referring back to FIG. 1, the method MT will be described in processing, for example, the substrate W shown in FIG. 2 in the plasma processing apparatus 1a. FIGS. 4 to 7 will be referred to, in addition to FIG. 1. FIGS. 4 to 6 are partially enlarged cross-sectional views of the substrate W during processing with the method MT shown in FIG. 1. FIG. 7 is a partially enlarged cross-sectional view of the substrate W during asking with the method MT shown in FIG. 1.

With the method MT, the first region R1 containing the first silicon-containing material is selectively etched with respect to the second region R2 containing the second silicon-containing material different from the first silicon-containing material. The first silicon-containing material forming the first region R1 is, for example, silicon oxide ($SiO_2$). The second silicon-containing material forming the second region R2 is, for example, silicon nitride (SiN).

The method MT includes steps S1 to S5. In step S1, the substrate W shown in FIG. 2 is placed onto the substrate support 11 to provide the substrate W. The substrate W includes the second region R2 defining the recess, the first region R1 received in the recess and covering the second region R2, and the mask MK placed on the first region R1 and having an opening with a greater width than the recess.

In step S2, the first region R1 is etched. The first region R1 may be etched through step S2 alone. In some embodiments, before step S2, the first region R1 may be etched through another plasma processing step until the second region R2 is exposed (refer to FIG. 4) or until immediately before the second region R2 is exposed. For example, the first region R1 may be etched using active species such as ions and/or radicals contained in the plasma generated from a fluorocarbon gas (hereinafter also referred to as a $C_xF_y$ gas) until the second region R2 is exposed or until immediately before the second region R2 is exposed. For example, the first region R1 may be exposed to plasma generated from a process gas containing a $C_xF_y$ gas and an inert gas such as an Ar gas through the mask MK to etch the first region R1 until the second region R2 is exposed.

In step S2, plasma is generated from a first process gas to form a deposit DP (refer to FIG. 5) of fluorocarbon on the substrate W. The first process gas contains carbon atoms and fluorine atoms. The first process gas may be a $C_xF_y$ gas. The first gas may contain an inert gas such as an Ar gas, in addition to the $C_xF_y$ gas. The first process gas may further contain an oxygen gas.

In step S2, in response to the second region R2 being exposed, the substrate W is exposed to the plasma generated from the first process gas containing carbon atoms and fluorine atoms using the first RF signal to form the deposit DP on the substrate W. The deposit DP thus forms on the first region R1 and on the exposed second region R2 (multiple raised regions PR).

Example conditions used in step S2 will now be described.

Pressure in the plasma processing space 10s: 10 to 50 mTorr (1.33 to 6.65 Pa)

First process gas: a gas containing a $C_xF_y$ ($C_4F_6$ and $C_4F_8$) gases, an $O_2$ gas, and an Ar gas First RF signal power: 50 to 500 W Second RF signal power: 50 to 500 W In step S2, the first process gas is supplied into the plasma processing space 10s, and the exhaust system 40 is controlled to maintain the pressure in the plasma processing space 10s at a specified pressure. In step S2, the first RF signal is provided to excite the first process gas in the plasma processing space 10s to generate plasma from the first process gas in the plasma processing space 10s. In step S2, at least either the first RF signal is controlled to a frequency of 60 to 300 MHz, or the substrate support 11 is controlled to a temperature of 100 to 200° C. In other words, the first RF signal may be controlled to a frequency of 60 to 300 MHz in step S2. In addition to or in place of the control of frequency of the first RF signal, the substrate support 11 may be controlled to a temperature of 100 to 200° C. in step S2. The temperature of the substrate support 11 is controlled using a temperature control fluid flowing through the channel 14a and the heater 14d in the lower electrode 111.

When the first RF signal is controlled to a frequency of 60 to 300 MHz and/or the substrate support 11 is controlled to a temperature of 100 to 200° C., the C component contained in the deposit DP has a higher ratio than the F component. The ratio of carbon atoms to fluorine atoms contained in the deposit DP can be controlled to a value greater than 1. An example deposit DP covering the first region R1 and the second region R2 is shown in FIG. 5A. As shown in FIG. 5A, the deposit DP is thicker on the second region R2 than on the first region R1.

In step S2, for example, the first RF signal is controlled to a frequency of 60 to 300 MHz. This increases the ratio of the C component to the F component contained in the deposit DP, allowing the ratio of carbon (C) atoms to fluorine (F) atoms in the deposit DP to be controlled to a value greater than 1.

However, when the first RF signal has a frequency higher than 300 MHz, the $C_4F_6$ gas dissociates excessively, and fluorine radicals increase in the plasma processing chamber 10, preventing selective etching.

When the first RF signal has a frequency lower than 60 MHz, the $C_4F_6$ gas dissociates insufficiently, and the ratio of fluorine radicals to carbon radicals increases in the plasma processing chamber 10, causing the deposit DP to contain more fluorine component. The ability to protect the second region R2 is thus lowered.

As described above, the first RF signal with a frequency of 60 to 300 MHz may be used in step S2 to sufficiently protect the second region R2 with the deposit DP and to reduce faceting of the raised region PR.

In step S2, the substrate support 11 may be controlled to a temperature of 100 to 200° C. to achieve the same advantageous effect. More specifically, when the substrate support 11 is controlled to a temperature of 100 to 200° C., the $C_4F_6$ gas dissociates to produce CF radicals with a higher ratio of fluorine, such as $CF_2$ and $CF_3$. Such CF radicals react with oxygen contained in the plasma and volatilize. Radicals with a higher ratio of carbon thus remain in the plasma processing chamber 10, forming a carbon-rich deposit DP.

However, when the substrate support 11 is set to a temperature higher than 200° C., the metal material of the mask MK may volatilize.

When the substrate support 11 is set to a temperature lower than 100° C., more deposit DP forms on the upper portions of the side walls of the recess and may block an opening HL (refer to FIG. 6).

As described above, the substrate support 11 may be set to a temperature of 100 to 200° C. in step S2 to sufficiently protect the second region R2 with the deposit DP and to reduce faceting of the raised region PR.

To form a deposit DP thick enough to serve as a protective film, the $C_xF_y$ gas used as the first process gas is to have a higher ratio of carbon atoms to fluorine atoms. For example, the ratio of carbon atoms to fluorine atoms in the first process gas may be a value of 0.5 or greater. The first process gas may include at least one selected from the group consisting of a $C_4F_6$ gas, a $C_5F_8$ gas, and a $C_4F_8$ gas.

In step S2, the first RF signal is provided to the upper shower head electrode 12. The first RF signal may have a power of 10 to 500 W. The first RF signal may be a continuous wave. In some embodiments, the first RF signal may be a pulsed wave. In step S2, the second RF signal may or may not be provided to the lower electrode 111.

In step S3, an inert gas such as an Ar gas is supplied toward the substrate W on which the deposit DP forms in step S2 to generate plasma from the inert gas to etch the first region R1.

Example conditions used in step S3 will now be described.

Pressure in the plasma processing space 10s: 10 to 50 mTorr (1.33 to 6.65 Pa)
  Second process gas: an Ar gas
  First RF signal power: 50 to 500 W
  Second RF signal power: 50 to 200 W In step S3, for example, an Ar gas is supplied into the plasma processing space 10s, and the exhaust system 40 is controlled to maintain the pressure in the plasma processing space 10s at a specified pressure. In step S3, the first RF signal is also provided to generate plasma from the inert gas in the plasma processing space 10s. In step S3, the second RF signal is provided to the lower electrode 111.

In step S3, the substrate W is exposed to ions of Ar gas atoms in the plasma. When the deposit DP is exposed to the ions of Ar gas atoms, the first region R1 is etched with radicals of fluorocarbon contained in the deposit DP as shown in FIG. 5B. In contrast, the deposit DP with the ratio of carbon atoms to fluorine atoms greater than 1 formed through step S2 protects the second region R2. More specifically, the deposit DP remaining on the second region R2, although it becomes thinner, can protect the second region R2 to reduce etching of the second region R2. Step S3 is performed in the manner described above. When a condition to stop etching is not satisfied in the subsequent step S4, steps S2 and S3 are repeated. In the state shown in FIG. 5B, the first region R1 received in the recess in the substrate W is etched further.

In step S4, the determination is performed as to whether the condition to stop etching is satisfied. In step S4, the condition to stop etching is satisfied when the count for the process sequences including steps S2 and S3 reaches a predetermined number. When the condition to stop etching is not satisfied in step S4, a process sequence including steps S2 and S3 is performed again. When the condition to stop etching is satisfied in step S4, the processing advances to step S5.

Steps S2 and S3 are alternately performed repeatedly to remove the first region R1 received in the recess defined by the second region R2 to form the opening HL as shown in FIG. 6. The process sequence including steps S2 and S3 may be performed once. The conditions for steps S2 and S3 are set not to stop etching the first region R1 because of an excessive deposit DP on the substrate W and also not to etch the second region R2 because of an insufficient deposit DP.

For a narrow recess defined by the second region R2, a thick deposit may form through step S2 on the first region R1 received in the narrow recess. A thick deposit on the first region R1 may prevent the first region R1 from being etched in step S3. For a narrow recess defined by the second region R2, a thin deposit DP is to form on the side walls of the recess. The method MT uses the first RF signal with a frequency of 60 to 300 MHz to facilitate dissociation of the $C_xF_y$ gas, and increases carbon-rich ion species, thus changing the composition of the deposit DP. The method MT thus allows a thinner deposit DP to form on the surfaces of the side walls of the recess than on the top surface of the raised region PR.

The substrate support 11 at a high temperature of 100 to 200° C. allows dissociation of the $C_xF_y$ gas to produce CF radicals with a higher ratio of fluorine, such as $CF_2$ and $CF_3$. Such CF radicals react with oxygen contained in the plasma and volatilize. Radicals with a higher ratio of carbon are thus likely to remain. This changes the composition of the deposit DP, allowing the deposit DP to form differently at different positions. The deposit DP can be controlled to be thicker in one area and thinner in another area, and thus can be thinner on the surfaces of the side walls of the recess than on the top surface of the raised region PR. A thinner deposit DP can form on the surfaces of the side walls of the recess than on the top surface of the raised region PR.

The method MT includes the next step S5. In step S5, the deposit DP is removed by ashing to complete the process.

After the process, the bottom region BR is selectively modified and is selectively etched with respect to the other areas in the second region R2. After the deposit DP is removed through step S5, the bottom region BR is selectively etched to expose the underlying region UR at the bottom of the recess as shown in FIG. 7.

Experiments

Experiments for evaluating the etching method according to one embodiment will now be described. In the experiments, sample chips with the same structure as the substrate shown in FIG. 2 were prepared. Each sample chip was processed with the method MT using the plasma processing apparatus 1a shown in FIG. 3. The method MT for the sample chip used the conditions described below.

Figure 8:
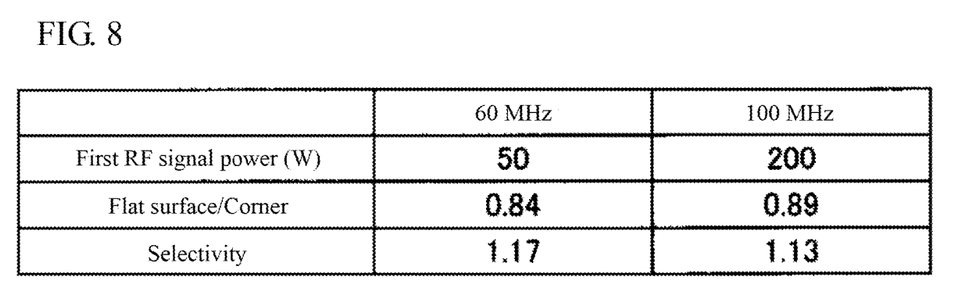
FIG. 8 is a table showing example experimental results of radio-frequency (RF) signals used with the method shown in FIG. 1.

Conditions for Method MT in Experiments
Conditions for Step S2
  Count of process sequences in step S2: 30
  First process gas: $C_xF_y$ ($C_4F_6$ and $C_4F_8$) gases, an $O_2$ gas, and an Ar gas (at the ratio of 1.5/1/264)
  First RF signal: 60 MHz, 50 W; 100 MHz, 200 W
  Second RF signal: 40 MHz, 50 W
  Pressure in the plasma processing space 10s: 20 mTorr (2.66 Pa)
  Processing time for each process sequence: 2 to 3 s
Conditions for Step S3
  Second process gas: an Ar gas
  First RF signal: 60 MHz, 50 W; 100 MHz, 200 W
  Second RF signal: 40 MHz, 200 W
  Pressure in the plasma processing space 10s: 20 mTorr (2.66 Pa)
  Processing time for each process sequence: 3 s
Conditions for Step S5
  Second process gas: an $O_2$ gas
  First RF signal: 60 MHz, 50 W
  Second RF signal: 40 MHz, 200 W
  Pressure in the plasma processing space 10s: 100 mTorr (13.3 Pa)
  Processing time for each process sequence: 40 s FIG. 8 is a table showing example experimental results of RF signals used with the method MT shown in FIG. 1. In this experiment, as shown in FIG. 8, silicon nitride in the first and second raised regions PRA and PRB included in the second region R2 had faceting (loss at corners) at a value of 0.84 or greater after asking. More specifically, the loss at corners 102 with respect to flat surfaces 101 of the first and second raised regions PRA and PRB shown in FIG. 7 was a value of 0.84 for the first RF signal with a frequency of 60 MHz and a value of 0.89 for the first RF signal with a frequency of 100 MHz. The selectivity of the first region R1 formed from silicon oxide to the second region R2 formed from silicon nitride was a value of 1 or greater. More specifically, the selectivity was a value of 1.17 for the first RF signal with a frequency of 60 MHz and a value of 1.13 for the first RF signal with a frequency of 100 MHz. The experiment reveals that the first RF signal set to a frequency of 60 to 300 MHz in step S2 can achieve an intended selectivity and also reduce the loss at the corners 102 of the second region R2 and retain the vertical features of the recess.

Figure 9:
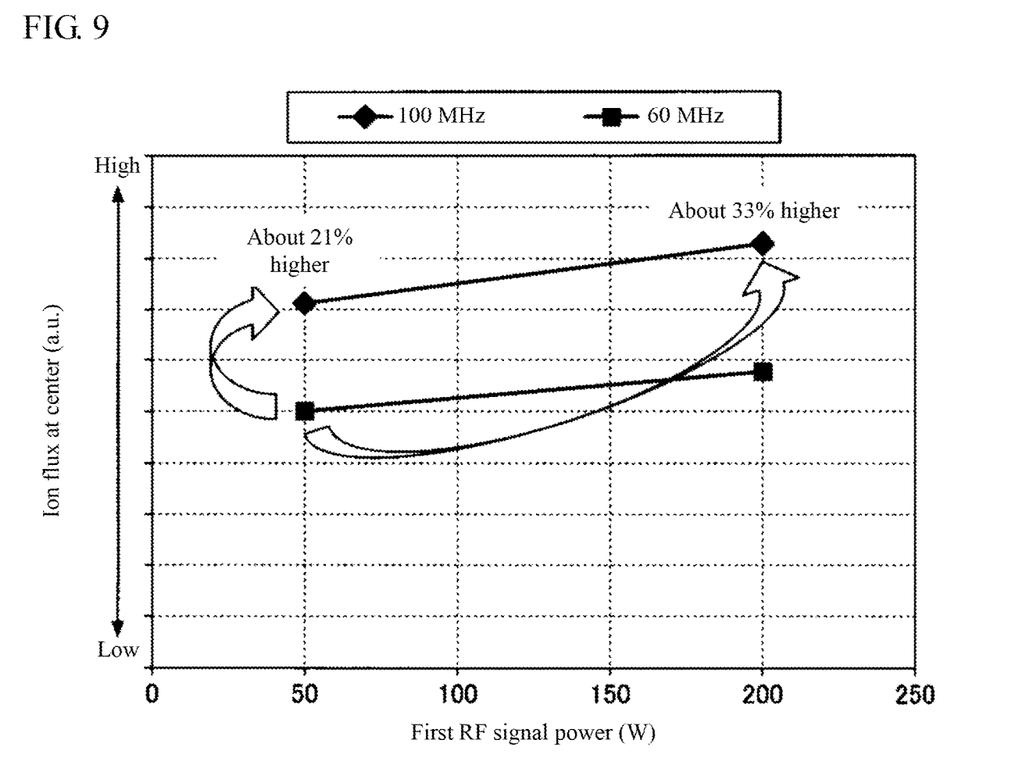
FIG. 9 is a graph showing example experimental results of the RF signals used with the method shown in FIG. 1.

FIG. 9 is a graph showing other example experimental results of the RF signals used with the method MT shown in FIG. 1 with the above conditions. As shown in FIG. 9, the first RF signals had a power ranging from 50 to 200 W indicated by the horizontal axis. In step S2, a more ion flux is observed at the center of the substrate W as indicated by the vertical axis at a higher power of the first RF signal, for both the first RF signal with a frequency of 100 MHz and for the first RF signal with a frequency of 60 MHz. The ion flux is an indicator of the plasma density. A higher ion flux value indicates a higher plasma density, thus indicating enhanced etching. The ion flux value at a power of 50 W was about 21% higher for the first RF signal with a frequency of 100 MHz than for the first RF signal with a frequency of 60 MHz. The ion flux value was about 33% higher at a power of 200 W for the first RF signal with a frequency of 100 MHz than at a power of 50 W for the first RF signal with a frequency of 60 MHz. The results reveal that the ion flux value is greater for the first RF signal having a higher frequency and for the first RF signal at a higher power.

Figure 10A:
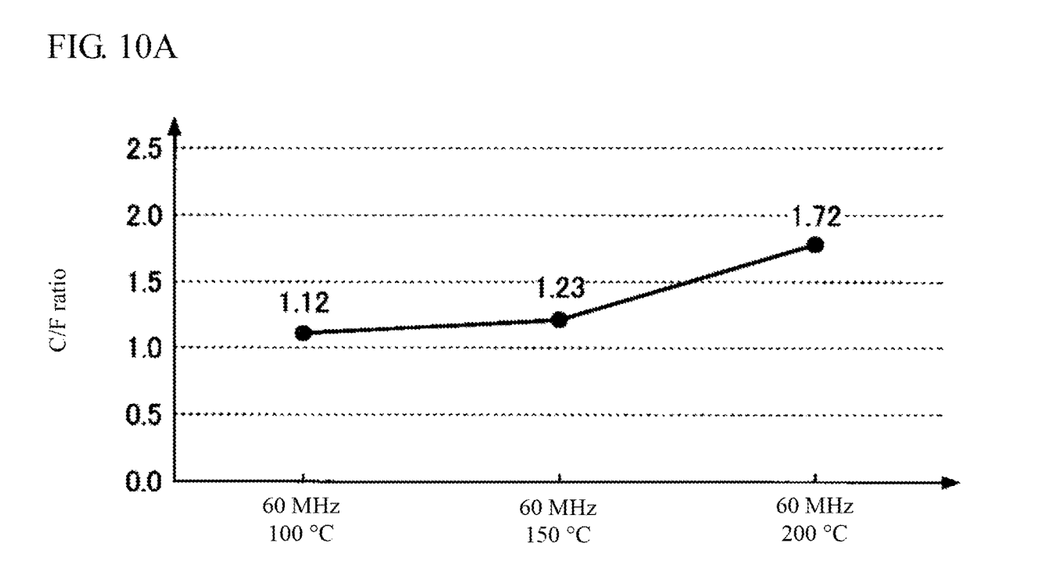
FIGS. 10A and 10B are graphs each showing example experimental results of the RF signals and the temperatures used with the method shown in FIG. 1.
Figure 10B:
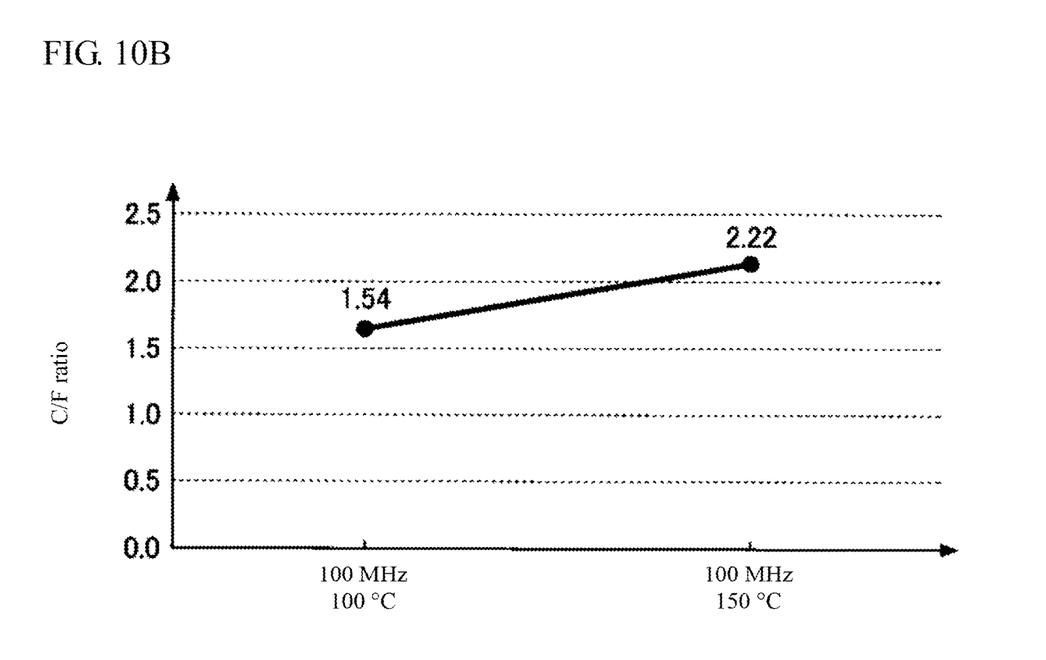

FIGS. 10A and 10B are graphs each showing example experimental results of the power of the first RF signals and the temperatures of the substrate support 11 used with the method MT shown in FIG. 1. In this experiment, a deposit DP was formed on a blanket wafer of silicon nitride, and the numbers of carbon atoms and fluorine atoms contained in the deposit DP were counted with X-ray photoelectron spectroscopy (XPS). The surface temperature of the ESC 112 was measured and used as the temperature of the substrate support 11.

As shown in FIG. 10A, the first RF signals were set to a frequency of 60 MHz as indicated by the horizontal axis, and the substrate support 11 was set to temperatures of 100, 150, and 200° C. The C/F ratio in the deposit DP is a value greater than 1 in all these cases, indicating a higher content of the C component than the F component. For the first RF signals with the same frequency, the $C_xF_y$ gases dissociate more and the C/F ratio in the deposit DP is greater at a higher temperature of the substrate support 11.

As shown in FIG. 10B, the first RF signals were set to a frequency of 100 MHz as indicated by the horizontal axis, and the substrate support 11 was set to temperatures of 100 and 150° C. The C/F ratio in the deposit DP is a value greater than 1 in all these cases as well. For the first RF signals with the same frequency, the $C_xF_y$ gas dissociates more and the C/F ratio in the deposit DP is greater at a higher temperature of the substrate support 11. For the substrate support 11 with the same temperature, as shown in FIGS. 10A and 10B, the $C_xF_y$ gases dissociate more and the C/F ratio in the deposit DP is greater at a higher frequency of the first RF signal.

As described above, the first RF signal controlled to a frequency of 60 MHz or higher increases the C/F ratio to form more deposit DP to protect the silicon nitride contained in the second region R2 and reduce faceting, while allowing etching of the silicon oxide contained in the first region R1.

For the first RF signal set to a frequency of 40 MHz, controlling the C/F ratio to a value of 1 or greater is difficult. In the present embodiment, the first RF signal with a frequency of 60 MHz or higher allows enhanced dissociation of the $C_xF_y$ gases and controls the C/F ratio to a value of 1 or greater, thus forming more deposit DP.

In addition, the C/F ratio is greater at a higher temperature of the substrate support 11 in the range of 100 to 200° C., both for the first RF signals with a frequency of 100 MHz and with a frequency of 60 MHz. For the first RF signal set to a frequency of 40 MHz, the C/F ratio can be controlled to a value of 1 or greater by controlling the temperature of the substrate support 11 in the range of 100 to 200° C., thus forming more deposit DP.

Figure 11A:
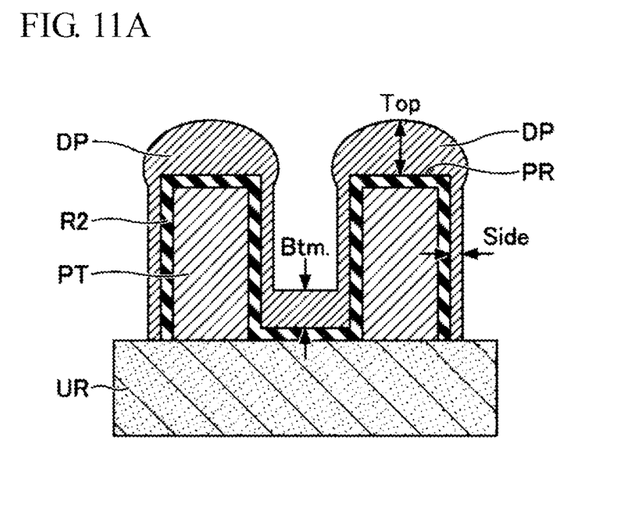
FIGS. 11A and 11B are a diagram and a graph showing example experimental results of a deposit formed with the method shown in FIG.
Figure 11B:
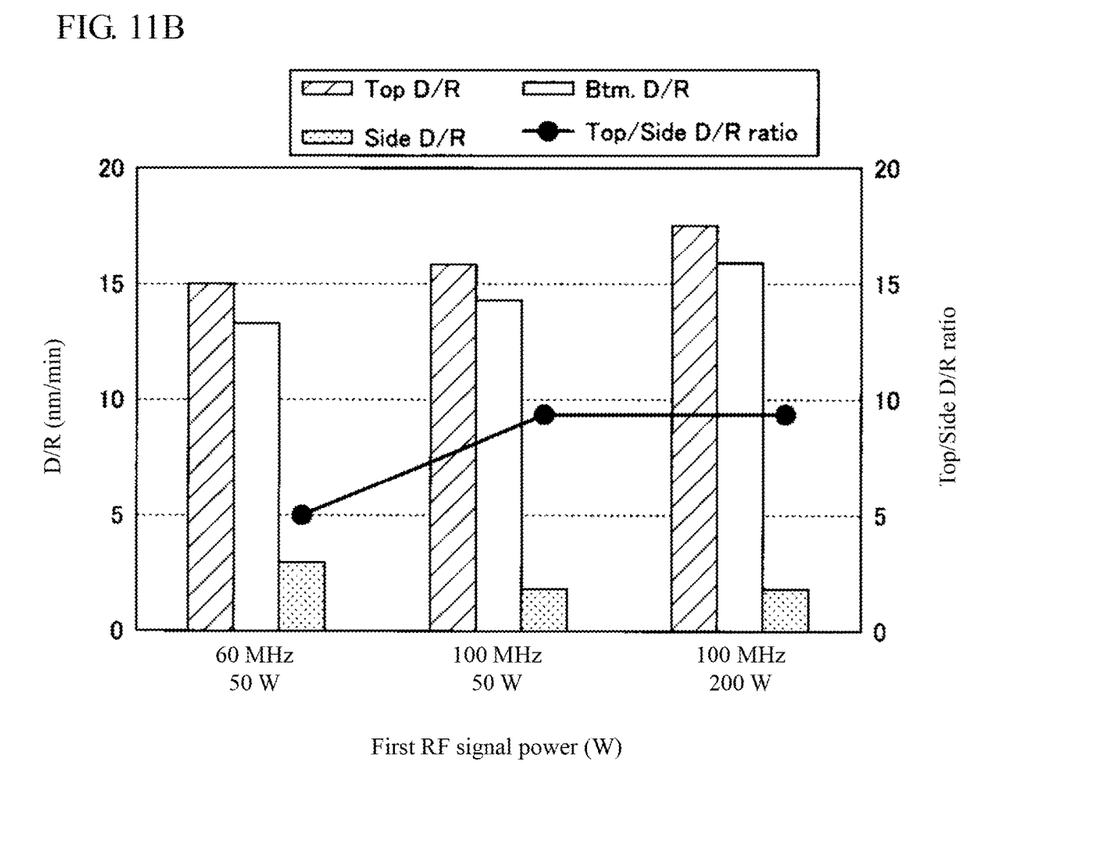

FIGS. 11A and 11B are a diagram and a graph showing example experimental results of the deposit DP formed with the method MT shown in FIG. 1. In FIG. 11A, Top D/R indicates the deposition rate of the deposit DP on the top of the raised region PR in the second region R2. Btm. D/R indicates the deposition rate of the deposit DP on the bottom of the recess in the second region R2, and Side D/R indicates the deposition rate of the deposit DP on the sides of the second region R2.

In FIG. 11B, a bar graph shows the deposition rate (D/R) at the top, bottom, and sides (in units indicated on the left vertical axis) for each power of the first RF signals as indicated by the horizontal axis, and a line graph shows the ratio of Top D/R to Side D/R (in units indicated on the right vertical axis). In step S2, the ratio of the thickness of the deposit DP on the raised region PR on the top surface of the second region R2 to the thickness of the deposit DP on the side surfaces of the second region R2 (Top/Side D/R ratio)

is a value of 5 or greater. In step S2, Side D/R, which is the deposition rate on the side surfaces of the second region R2, is a value of 5 or less.

With the method MT, the deposit DP is about ⅕ thinner on the side walls of the recess than on the top surface of the raised region PR. For the recess with a narrow width defined by the second region R2, a thinner deposit DP can form on the side walls of the recess, allowing etching of silicon oxide received in the recess.

As described above, the etching method according to the present embodiment can control the ratio of carbon atoms to fluorine atoms contained in the deposit DP to a value greater than 1. This forms more deposit DP to increase the selectivity of the first region R1 containing silicon oxide to the second region R2 containing silicon nitride. This reduces the loss at the corners of the second region R2 and allows the opening HL to be etched vertically.

The etching method and the plasma processing apparatus according to one embodiment disclosed herein are illustrative in all aspects and should not be construed to be restrictive. The components in the above embodiments may be altered or modified in various forms without departing from the spirit and scope of the appended claims. The features described in the above embodiments may have other configurations or may be combined unless any contradiction arises.

Although various embodiments have been described above, the embodiments are not restrictive, and various modifications may be made. For example, the method MT may be implemented with a plasma processing apparatus other than the plasma processing apparatus 1a, such as a capacitively coupled plasma processing apparatus other than the plasma processing apparatus 1a. In addition, the method MT may be implemented with an inductively coupled plasma processing apparatus or a plasma processing apparatus that excites a gas using surface waves such as microwaves. For example, the plasma processing apparatus according to the present disclosure may be any type of plasma processing apparatus, including an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus.

REFERENCE SIGNS LIST

1a Plasma processing apparatus
1b Controller
10 Plasma processing chamber
10s Plasma processing space
11 Substrate support
12 Upper shower head electrode
14a Channel
14d Heater
20 Gas supply
24 Heater power supply
30 RF power supply
40 Exhaust system
111 Lower electrode
112 Electrostatic chuck (ESC)
113 Edge ring
31a, 31b RF generator
W Substrate
R1 First region
R2 Second region
PR Raised region
PRA First raised region
BR Bottom region
PRB Second raised region
BR Bottom region
DP Deposit
MK Mask
PT Protrusion
UR Underlying region

What is claimed is:

1. An etching method, comprising:
   (a) providing a substrate on a substrate support in a chamber, the substrate including
      a first region formed of a silicon oxide,
      a second region including raised regions, the second region being formed of a silicon nitride, the second region defining a recess that is formed by the raised regions, and the first region being present in the recess and covering the second region, and
      a mask on the first region, the mask having an opening that is wider than the recess;
   (b) etching the first region until the second region is exposed or until immediately before the second region is exposed;
   (c) exposing the substrate to plasma generated from a first process gas containing a fluorocarbon gas using a radio-frequency signal, thereby forming a deposit on the substrate;
   (d) after (c), exposing the deposit to plasma generated from a second process gas containing an inert gas using a radio-frequency signal, thereby selectively etching the first region with respect to the second region, the second process gas being substantially free of the fluorocarbon gas; and
   (e) repeating (c) and (d),
   wherein (c) includes using the radio-frequency signal with a frequency of 60 to 300 MHz and/or setting the substrate support to a temperature of 100 to 200° C. to control a ratio of carbon atoms to fluorine atoms contained in the deposit to a value greater than 1.

2. The etching method according to claim 1, wherein (c) includes using the radio-frequency signal with a frequency of 60 to 300 MHz.

3. The etching method according to claim 1, wherein (c) includes setting the substrate support to a temperature of 100 to 200° C.

4. The etching method according to claim 1, wherein in (c), a ratio of a thickness of the deposit on a top surface of the second region to a thickness of the deposit on a side surface of the second region is a value of 5 or greater.

5. The etching method according to claim 1, wherein in (c), a deposition rate of the deposit on a side surface of the second region is a value of 5 or less.

6. The etching method according to claim 1, wherein a ratio of carbon atoms to fluorine atoms contained in the first process gas is 0.5 or greater.

7. The etching method according to claim 1, wherein the first process gas includes at least one selected from the group consisting of a $C_4F_6$ gas, a $C_5F_8$ gas, and a $C_4F_8$ gas.

8. The etching method according to claim 1, wherein (c) includes providing the radio-frequency signal to an electrode facing the substrate support.

9. The etching method according to claim 1, wherein the radio-frequency signal has a power of 10 to 500 W.

10. The etching method according to claim 1, wherein the radio-frequency signal is a continuous wave.

11. The etching method according to claim 1, wherein in (c), the substrate is exposed to the plasma at a timing in which the second region is exposed, and the formed deposit is formed on an entire exposed surface of the first region and the second region.

12. The etching method according to claim 1, wherein the deposit is thicker on the second region than on the first region.

13. The etching method according to claim 1, wherein in (c), the substrate is exposed to the plasma at a timing in which the second region is exposed, and the formed deposit is formed on an entire exposed surface of the first region, the second region, and the mask.

14. The etching method according to claim 1, wherein (d) includes using the deposit in which the ratio of the carbon atoms to the fluorine atoms is controlled to the value greater than 1, thereby selectively etching the first region while suppressing etching of the second region.

15. The etching method according to claim 1, wherein the deposit on a side surface of the recess is thinner than the deposit on an upper surface of each raised region.

16. The etching method according to claim 1, wherein each of (b) and (c) includes setting the radio-frequency signal at the frequency of 60 to 300 MHz.

17. The etching method according to claim 1, wherein (d) includes supplying a second radio-frequency signal to the substrate support.

18. The etching method according to claim 17, wherein in (c), the second radio-frequency signal is not supplied to the substrate support.

19. A plasma processing apparatus, comprising:
a chamber having one or more gas inlets and one or more gas outlets;
a substrate support provided in the chamber;
an electrode facing the substrate support;
a plasma generator; and
a controller,
wherein the controller is configured to cause:
(a) placing a substrate on the substrate support in the chamber, the substrate including
a first region formed of a silicon oxide,
a second region including raised regions, the second region being formed of a silicon nitride the second region defining a recess that is formed by the raised regions, and the first region being present in the recess and covering the second region, and
a mask on the first region, the mask having an opening that is wider than the recess,
(b) etching the first region until the second region is exposed or until immediately before the second region is exposed,
(c) exposing the substrate to plasma generated from a first process gas containing a fluorocarbon gas using a radio-frequency signal, thereby forming a deposit on the substrate,
(d) after (c), exposing the deposit to plasma generated from a second process gas containing an inert gas using a radio-frequency signal, thereby selectively etching the first region with respect to the second region, the second process gas being substantially free of the fluorocarbon gas, and
(e) repeating (c) and (d), and
the controller performs (c) including using the radio-frequency signal with a frequency of 60 to 300 MHz and/or setting the substrate support to a temperature of 100 to 200° C. to control a ratio of carbon atoms to fluorine atoms contained in the deposit to a value greater than 1.

\* \* \* \* \*